United States Patent [19]
Mehringer et al.

[11] Patent Number: 5,869,883
[45] Date of Patent: Feb. 9, 1999

[54] PACKAGING OF SEMICONDUCTOR CIRCUIT IN PRE-MOLDED PLASTIC PACKAGE

[75] Inventors: Larry H. Mehringer, Saratoga; Charlie Oh, Palo Alto, both of Calif.

[73] Assignee: Stanley Wang, President PanTronix Corp., Fremont, Calif.

[21] Appl. No.: 938,874

[22] Filed: Sep. 26, 1997

[51] Int. Cl.⁶ .................................................. H01L 23/495
[52] U.S. Cl. .................. 257/667; 257/673; 257/674; 257/675; 257/676; 257/688; 257/706
[58] Field of Search .................................... 257/667, 668, 257/669, 673, 674, 675, 676, 682, 687, 688, 689, 706, 727

[56] References Cited

U.S. PATENT DOCUMENTS

| | | | |
|---|---|---|---|
| 3,930,114 | 12/1975 | Hodge | 174/52 |
| 4,809,053 | 2/1989 | Kuraishi | 357/70 |
| 5,057,903 | 10/1991 | Olla | 357/72 |
| 5,206,794 | 4/1993 | Long | 257/675 |
| 5,213,748 | 5/1993 | Biswas et al. | 264/251 |
| 5,381,042 | 1/1995 | Lerner et al. | 257/712 |
| 5,442,234 | 8/1995 | Liang | 257/675 |
| 5,483,098 | 1/1996 | Joiner, Jr. | 257/676 |
| 5,485,037 | 1/1996 | Marrs | 257/712 |
| 5,491,362 | 2/1996 | Hamzehdoost et al. | 257/675 |
| 5,598,034 | 1/1997 | Wakefield | 257/706 |

*Primary Examiner*—Ngân V. Ngô

[57] ABSTRACT

An inexpensive pre-molded package for electronic semiconductor circuit with increased thermal extraction capability, improved electrical performance, improved dielectric constant of sealing medium, optically transmissive sealing lid, and partially reduced electromagnetic radiation. In one embodiment, the pre-molded package includes electronic semiconductor circuit, a plurality of electrically conductive leads, a heat spreader, a plurality of electrically conductive bond wires, and a seal lid. Preferably, a surface of the heat spreader remains exposed to the exterior of the pre-molded package. In another embodiment, the pre-molded package includes a semiconductor circuit, a plurality of electrically conductive leads, a heat spreader, a plurality of electrically conductive bond wires, and an optically transmissive seal lid.

34 Claims, 10 Drawing Sheets

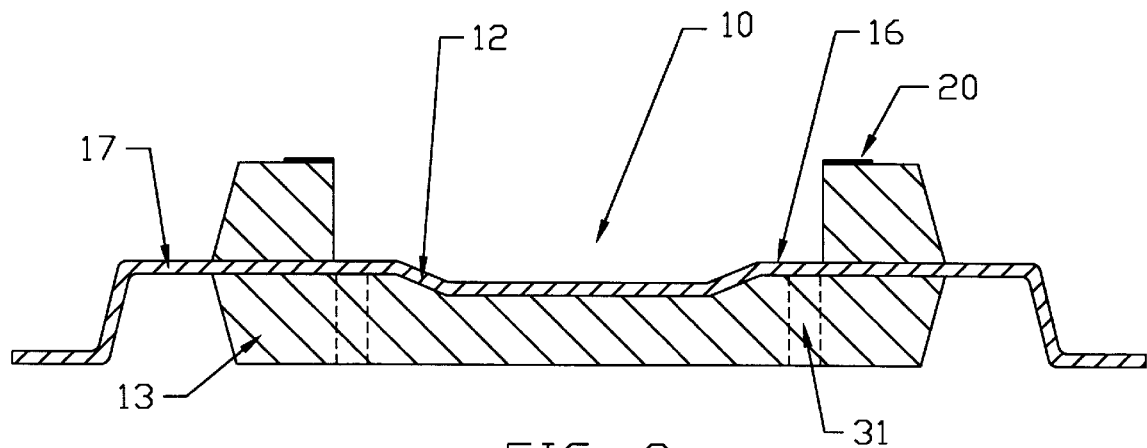
FIG. 3
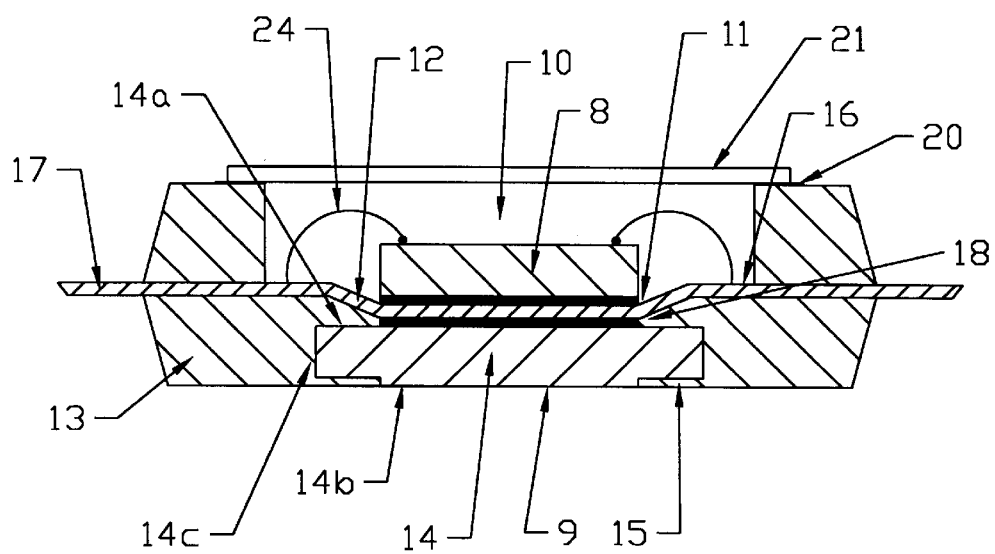
FIG. 4    PKG425a

PACKAGING OF SEMICONDUCTOR CIRCUIT IN PRE-MOLDED PLASTIC PACKAGE

BACKGROUND—FIELD OF INVENTION

A semiconductor circuit device packaged in an inexpensive molded plastic package does not provide the electrical performance of a device packaged in an expensive ceramic or metal package that provide a die cavity. The dielectric constant of the air in the die cavity formed in the ceramic or metal package is 1.0 where as plastic is about 4.4.

The latest semiconductor devices have greatly increased device complexity and transistor gate count even more rapidly than with the reduction of the semiconductor device processing from 1.0 micron to sub-micron technologies. This proliferation of device functionality and increase in operational frequency response requirements of most semiconductor devices are beyond the normal dielectric constant range of the plastic package which is nominally greater than 1. The demand for low cost molded plastic packaging of these highly complex functional and high frequency semiconductor devices requires a novel solution to meet requirements of 2, 3, or more giga-hertz devices per plastic package.

The concept of displacing plastic material surrounding and contacting the device for low cost plastic packaging to meet these requirements has been reduced to practice by creating a pre-molded plastic package die cavity to reduce the dielectric constant of the semiconductor circuit device by hard ejection or transfer mold package tooling or pre-cast die attach cavity spacer. The cavity has been arranged to provide the semiconductor circuit device with an air dielectric medium which is approximately ½ or less than that of a molded plastic package. This feature of the pre-molded plastic package improves the electrical performance of these complex and high frequency semiconductor circuit devices.

BACKGROUND—PRIOR ART

A pre-molded plastic package body is formed in an ejection or transfer mold prior to a semiconductor device being attached directly to a die attach paddle of a lead frame or to a rerouting board using a number of conventional techniques including welding, soldering, brazing, and adhesive bonding. The semiconductor device is then interconnected to the lead frame or rerouting board prior to sealing of the pre-molded package plastic body housing the semiconductor device to form the protective body of the pre-molded plastic package. Examples of prior art are discussed in the following paragraphs.

U.S. Pat. No. 3,930,114 to Hodge discloses a plastic package including a thermally conductive body which extends from the lead frame die pad supporting the semiconductor circuit to the external surface of the package. However, in order to stabilize the thermally conductive body during the encapsulation process, Hodge requires stabilizing legs which extend to the opposite surface of the plastic body. This package design, because of the many plastic-to-metal interfaces extending directly from the external package surface to the semiconductor circuit cavity, fails to provide adequate protection against invasion by water vapor and the like and fails to provide the pre-molded die attach cavity necessary to reduce the dielectric constant of the semiconductor device.

U.S. Pat. No. 4,809,053 to Kuraishi discloses a plastic package including a metal lead frame having at least one heat spreader extending from the die paddle on which a semiconductor chip is mounted from the periphery of the die paddle and existing in a space defined between the die paddle and the inner ends of the leads. The thermal conductivity of such an internally encapsulated heat spreader cannot approach the thermal conductivity of exposed metals and ceramics and, accordingly, this package concept fails to provide adequate means for rapidly conducting heat to the package surface and also fails to provide the pre-molded die attach cavity necessary to reduce the dielectric constant of the semiconductor device.

U.S. Pat. No. 5,057,903 to Olla discloses a plastic package structure in which a body of plastic containing particles of thermally conductive material is used to conduct heat from the chip directly to the package surface. However, the thermal conductivity of such metal-impregnated plastic cannot approach the thermal conductivity of metals and ceramics and, accordingly, this package concept fails to provide adequate means for rapidly conducting heat to the package surface and also fails to provide the pre-molded die attach cavity necessary to reduce the dielectric constant of the semiconductor device.

U.S. Pat. No. 5,206,794 to Long discloses a plastic package structure in which silicone compound is first applied over the exposed surface of the integrated circuit, its bonding wires, and portions of the lead frame prior to molding in plastic. The coated bonding wires and the lead frame conduct heat away from the semiconductor circuit. However, the thermal conductivity of such silicone coated bonding wires and lead frame cannot approach the thermal conductivity of metals and ceramics and, accordingly, this package concept fails to provide adequate means for rapidly conducting heat to the package surface and also fails to provide the pre-molded die attach cavity necessary to reduce the dielectric constant of the semiconductor device.

U.S. Pat. No. 5,381,042 to Lerner et al discloses a plastic package structure in which a body of plastic surrounds the semiconductor circuit, lead frame, and heat slug, preferably formed from oxygen-free high-conductivity copper, that has an exposed surface outside the package. This package concept fails to provide adequate means for rapidly conducting heat to the package surface because of high thermal resistance copper oxidation formed on the oxygen-free copper "drop-in" heat slug surface exposed during ejection and transfer molding process and subsequent high temperature post mold cure operation and also fails to provide the pre-molded die attach cavity necessary to reduce the dielectric constant of the semiconductor device. The disclosure also fails to address the unnecessary steps of removing the high thermal resistance copper oxide and requirement for a post cleaning and post plating operation to prevent the copper "drop-in" heat slug from further oxidation.

U.S. Pat. No. 5,442,234 to Liang discloses a plastic package structure in which an integrated circuit die is attached to one side of the die attach paddle and a heat sink is resiliently fixed to the other side of the die attach paddle using a viscous thermal grease between heat sink and the die attach paddle. The heat sink is ejection molded into the plastic package forming the structure. However, the thermal conductivity of such heat sink attachment by thermal grease cannot approach the thermal conductivity of metals and ceramics and, accordingly, this package concept fails to provide adequate means for rapidly conducting heat to the package surface and also fails to provide the pre-molded die attach cavity necessary to reduce the dielectric constant of the semiconductor device.

U.S. Pat. No. 5,483,098 to Joiner, Jr. discloses a plastic package structure in which an integrated circuit die is attached to one side of the die attach paddle and a substantial portion of the inactive side of the die is left open to the environment. While this structure does provide a direct path for thermal conductivity from the integrated circuit die to a metal or ceramic heat sink, this package concept fails to provide adequate mechanical protection of the integrated circuit die during mounting of the heat sink leading to the plastic package, an adequate moisture barrier to water vapor penetration and the like into the plastic package, and also fails to provide the pre-molded die attach cavity necessary to reduce the dielectric constant of the semiconductor device.

U.S. Pat. No. 5,485,037 to Marrs discloses a plastic package structure in which an integrated circuit die is attached to one side of a oxygen-free high thermally conductive thermal induction plate and the thermal induction plate is molded in the plastic package leaving an exposed surface outside the package. This package concept fails to provide adequate means for rapidly conducting heat to the package surface because of high thermal resistance copper oxidation formed on the oxygen-free thermal induction plate surface exposed during ejection and transfer molding process and subsequent high temperature post mold cure operation and also fails to provide the pre-molded die attach cavity necessary to reduce the dielectric constant of the semiconductor device. The disclosure also fails to address the unnecessary steps of removing the high thermal resistance copper oxide and requirement for a post cleaning and post plating operation to prevent the copper thermal induction plate from further oxidation.

U.S. Pat. No. 5,491,362 to Hamzehdoost et al discloses a plastic package structure for an integrated circuit includes a package body having a die-cavity formed therein, in which an integrated circuit die is attached to a die mounting ring and a substantial portion of the inactive side of the die is left open to the environment. While this structure does provide a direct path for thermal conductivity from the integrated circuit die to a metal or ceramic heat sink, this package concept fails to provide adequate mechanical protection of the integrated circuit die during mounting of the heat sink leading to the plastic package or an adequate moisture barrier to water vapor penetration and the like into the plastic package.

U.S. Pat. No. 5,598,034 to Wakefield disclosures a plastic package structure in which a body of plastic containing a gas-filled cavity or chamber to surround the semiconductor circuit and provides an electromagnetic radiation shield surrounding the semiconductor circuit. This package concept fails to provide adequate means for rapidly conducting heat to the package surface because of high thermal resistance copper oxidation formed on the oxygen-free copper heat slug surface exposed during ejection and transfer molding process and subsequent high temperature post mold cure operation. The disclosure also fails to the unnecessary steps of removing the high thermal resistance copper oxide and requirement for a post cleaning and post plating operation to prevent the copper heat slug from further oxidation.

OBJECTS AND ADVANTAGES

Accordingly, several objects and advantages of my invention are listed. In accordance with the present invention a pre-molded plastic package for electronic semiconductor circuits is provided in which a die attach cavity is formed to contain the semiconductor circuit. The pre-molded package provides a cavity for attachment of the semiconductor circuit device directly to a die attach paddle of a lead frame or to a rerouting board using a number of conventional techniques including welding, soldering, brazing, and adhesive bonding. To assure rapid conduction of heat from the semiconductor circuit, the package may also include a thermally conductive body of metal, ceramic or the like which acts as a heat transfer body extending directly from the lead frame die pad to the surface of the plastic package. Heat may thus be conducted by the thermally conductive body directly from the semiconductor circuit to the package surface for extraction and dissipation.

The pre-molded plastic package cavity provides the environment for the semiconductor device to operate in an air dielectric medium thus reducing the capacitive loading and mechanical stress on the semiconductor device, and providing the semiconductor device the ability to transmit optically. The sealing process of the plastic pre-molded package allows for a varied selection of sealing medium including but not limited to plastic, metal, ceramic, or optically transmissive materials.

However, a substantially vapor-proof barrier must be formed between the plastic body and the heat transfer body. Plastics bond fairly well to ceramics. However, to provide an adequate seal between metal heat transfer bodies and the plastic body, the interface or junction between the metal heat transfer body and the plastic encapsulation material is adapted to provide an elongated path between the exterior of the package and the internal cavity containing the semiconductor circuit. The elongated junction thus provides a barrier to water vapor encroachment into the package and, because the metal-to-plastic junctions between the metal body and the plastic body do not form straight lines, the possibility of vapor leakage resulting from mismatch of coefficient of thermal expansion is minimized. Furthermore, by forming an irregular interface between the heat transfer body and the plastic body, mechanical integrity is assured and the package is much more resistant to mechanical stress. The packages of the invention thus permit use of inexpensive plastic packaging techniques to produce packages having direct conduction of heat from the interior of the package to the package surface without increased risk of water vapor leakage and without loss of mechanical package stability.

Still further objects and advantages will become apparent from a consideration of the ensuing description and accompanying drawings.

BRIEF DESCRIPTION OF THE DRAWINGS

FIG. 3 is a sectional view of a pre-molded plastic package illustrating an alternate embodiment of the invention;

FIG. 4 is a sectional view of a pre-molded plastic package illustrating an alternative embodiment of the invention including die paddle, lead frame, and a partial electromagnetic radiation shield;

Figure 1:
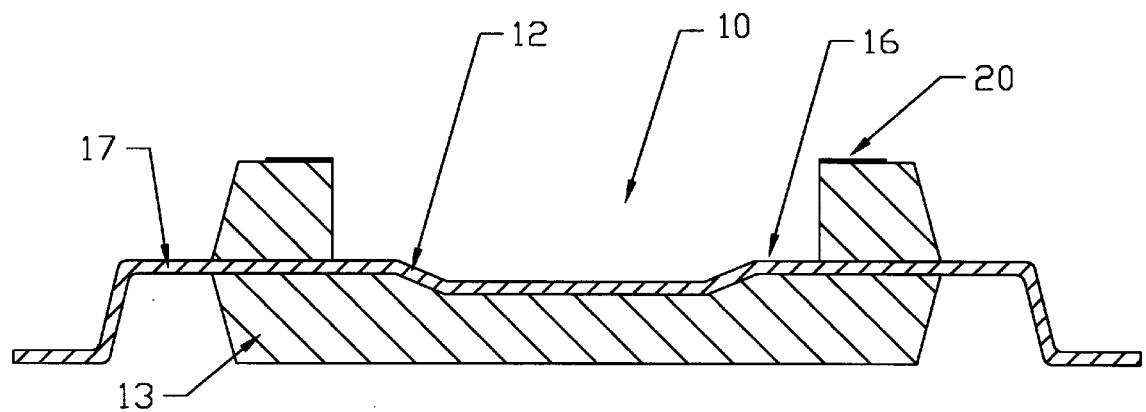
FIG. 1 is a sectional view of a pre-molded plastic package illustrating one embodiment of the invention.

REFERENCE NUMERALS semiconductor circuit 8
barrier metal 9
pre-molded die attach cavity area 10
semiconductor circuit attach material 11
die paddle 12
package plastic body 13
metal body 14
surface 14a
surface 14b
metal-to-plastic junction 14c
inwardly extending retaining flange 15
interconnection area 16
terminal leads 17
heat spreader interface 18
metal body 19
surface 19a
surface 19b
metal-to-plastic, ceramic, metal or other material junction 19c
seal area 20
seal lid 21
rerouting board 22
rerouting board interface upper 23
wires 24
wires 25
wires 26
rerouting board interface under 27
optical lens 28
lead frame 29
lead frame alignment holes 30
support pin holes 31
lead frame tie bars 32
tie bar downset 33
dam bar 34
ejection or transfer mold 100
upper mold half 100a
lower mold half 100b
mold cavity 110
contact surface 111
contact surface 112
mold alignment pins 120
lead frame with attached heat spreader height 130
lower mold half height 140
encapsulant channel 150
lead frame height 160
lead frame support pins 170
die paddle or rerouting board support 175
pre-cast die attach cavity spacer 180
casting fixture upper half 190
casting fixture lower half 200
pre-cast die attach cavity spacer height 210
upper half mold cavity height 220
casting fixture alignment pins 230

SUMMARY

This invention relates to packaging of electronic semiconductor circuit devices. More particularly, it relates to packaging arrangements which include an pre-molded plastic package for semiconductor circuits to permit use of plastic packaging for highly complex and high frequency devices and to arrangements which provide improved electrical operational environment and rapid conduction of thermal energy from the circuit component to the package exterior. The novel arrangements are formed employing relatively inexpensive and versatile plastic packaging techniques. This invention also relates to packaging arrangements which reduces electromagnetic radiation into or out of the package structure.

Advances in microelectronics technology and materials tend to develop semiconductor circuits which occupy less physical space while performing more advanced functions at higher operational frequencies. Traditionally, semiconductor circuits are packaged for use in housings which protect the semiconductor circuit from its environment and provide means for input/output communications between the semiconductor circuit and external circuitry. The continuing drive toward miniaturization thus results in higher operational frequencies and generation of more heat in less physical space with less structure for removing heat from the package structure. Similarly, the development of electronic semiconductor circuits using compound semiconductors, sensors, or optically transmissive circuits further expands the requirements for packaging which can contain devices operating at much higher operating frequencies and higher temperatures and control of device performance by improved environment and temperatures by heat dissipation.

Miniaturization of semiconductor circuit devices has also led to packaging of more than one semiconductor circuit within a single package housing. The semiconductor circuits may be supported on one or both sides of a substrate or rerouting board. For purposes of this disclosure, the terms "chip", "die", or "semiconductor circuit" and the like are used interchangeably and are intended to cover all electronic circuit device configurations enclosed within a single housing or package structure, regardless of whether such device configuration is in the form of one or more pieces of semiconductor material and/or supporting interconnection structure.

Conventionally, high pin-count package structures are generally either ceramic packages or plastic packages.

Ceramic packages are better heat conductors than plastic packages, contain a die attach cavity area, provide for hermetic sealing, and are thus generally considered more reliable. However, ceramic packaging is relatively expensive when compared to plastic packaging structures. Transfer and injection pre-molded plastic packaging is much less expensive and will be therefore widely used when the advantage of hermetic sealing are not essential to the semiconductor circuit.

Electronic semiconductor circuits generate heat in operation and, in most cases, the semiconductor circuits are temperature sensitive. The temperature at which the semiconductor circuit operates and the ability to remove heat from the semiconductor circuit may, in fact, determine or limit various operating characteristics of the circuit. The encapsulating plastic, however, is not a particularly effective heat transfer medium. Accordingly, as the density of semiconductor circuit functions increases, the need for effective heat dissipation increases. Where the device semiconductor circuit is encapsulated in the plastic, removal of thermal energy is difficult. Thus, a means is often provided for conducting heat from the package to an external heat sink.

Electronic semiconductor circuits operating at much higher frequencies of operation and, in most cases, the semiconductor circuits are sensitive to the dielectric constant of sealing medium. The dielectric constant of the sealing medium in which the semiconductor circuit operates and the ability to operate at higher frequencies may, in fact, determine or limit various operating characteristics of the circuit. In the simple pre-molded plastic package structures, the dielectric constant may be adequately lowered by the encapsulated air environment.

From the foregoing description it will become apparent that by using the principles of the invention pre-molded plastic packaging techniques may be modified to form various configurations of plastic packages which efficiently and effectively provide a cavity to reduce capacitance loading and conduct heat from the device semiconductor circuit to external surfaces of the packages. It will be appreciated, of course, that various combinations and variations of the specific embodiments illustrated and described can be used to achieve particular desired results. It is to be understood, therefore, that although the invention has been described with particular reference to specific embodiments thereof, the forms of the invention shown and described in detail are to be taken as preferred embodiments, Various changes, combinations and modifications thereof may be resorted to without departing from the spirit and scope of the invention as defined by the appended claims.

PREFERRED EMBODIMENTS—DESCRIPTION

In accordance with the present invention a pre-molded plastic package for electronic semiconductor circuits is provided in which a pre-molded die attach cavity area and a barrier plated surface, nickel or some other metal, heat spreader is formed around the semiconductor circuit. To assure rapid conduction of heat from the semiconductor circuit, the package may also include a thermally conductive body of metal, ceramic or the like which acts as a heat transfer body extending directly from the lead frame die pad to the surface of the plastic package. Heat may thus be conducted by the thermally conductive body directly from the semiconductor circuit to the package surface for extraction and dissipation. However, a substantially vapor-proof barrier must be formed between the plastic body and the heat transfer body. Plastics bond fairly well to ceramics. However, to provide an adequate seal between metal heat transfer bodies and the plastic body, the interface or junction between the metal heat transfer body and the plastic encapsulation material is adapted to provide an elongated path between the exterior of the package and the internal cavity containing the semiconductor circuit. The elongated junction thus provides a barrier to water vapor encroachment into the package and, because the metal-to-plastic junctions between the metal body and the plastic body do not form straight lines, the possibility of vapor leakage resulting from mismatch of coefficient of thermal expansion is minimized. Furthermore, by forming an irregular interface between the heat transfer body and the plastic body, mechanical integrity is assured and the package is much more resistant to mechanical stress. The packages of the invention thus permit use of inexpensive plastic packaging techniques to produce packages having direct conduction of heat from the interior of the package to the package surface without increased risk of water vapor leakage and without loss of mechanical package stability.

In accordance with a preferred embodiment of the invention the electronic semiconductor circuit is contained within a pre-molded die attach cavity area. The invention thus permits use of relatively inexpensive plastic packaging techniques to package much higher frequency electronic semiconductor circuits and devices which generate excessive amounts of heat. Other features and advantages of the invention will become more readily understood from the following detailed description taken in connection with the appended claims and attached drawings.

The general principles of molded plastic packaging structures are well known. Ordinarily, a metal lead frame is employed which includes a die paddle and lead frame with terminal leads arranged in a pre-selected arrangement. The semiconductor circuit device is attached to the die paddle and wire bonding or the like used to interconnect bonding pads on the device semiconductor circuit to the terminal leads. The assemblies are then encapsulated in a thermoset molding compound using a transfer or injection molding process. The general process, which is well known, may be used to produce various configurations of device package structure. Lead frames for plastic packages employ various configurations, all of which generally include a plurality of terminal leads which define a semiconductor circuit location and extend outwardly therefrom. When the plastic package is formed on the lead frame, the semiconductor circuit device location and inner ends of the terminal leads are encapsulated in a plastic body defined by opposed major faces and opposed edges with terminal leads extending from at least one of the edges. The leads extending from the edge may be formed into any of various configurations for mounting and interconnection purposes.

The pre-molded plastic package encapsulates a metal lead frame which ordinarily includes a die paddle and lead frame, lead frame with heat spreader, or lead frame with rerouting board and heat spreader with terminal leads arranged in a pre-selected arrangement in a thermoset molding compound using a transfer or injection molding process. The semiconductor circuit device is attached to the die paddle or rerouting board and wire bonding or the like used to interconnect bonding pads on the semiconductor circuit device to the terminal leads. The general process may be used to produce various configurations of device package structures. Lead frames for plastic packages employ various configurations, all of which generally include a plurality of terminal leads which define a semiconductor circuit location and extend outwardly therefrom. When the pre-molded plastic package is formed on the lead frame, the semiconductor circuit device location and bottom and sides of inner ends of the terminal leads are encapsulated in a plastic body defined by opposed major faces and opposed edges with terminal leads extending from at least one of the edges. The leads extending from the edge may be formed into any of various configurations for mounting and interconnection purposes, all of which are within the scope of this invention.

For purposes of simplicity and clarity of illustration, the invention is described herein with reference to the pre-molded plastic package body 13 configuration generally described as but not limited to a quad flatpack which has gullwing leads as shown in FIG. 1 extending from all four lateral smooth flat surfaces, the pre-molded die attach cavity area 10 which provides area for semiconductor circuit 8 attachment and reduction of dielectric constant, die paddle 12, pre-molded package plastic body 13, interconnection area 16, terminal leads 17, and seal area 20. The structure is formed by placing the lead frame 29 containing the die paddle 12 and lead frame tie bars 32 into a ejection or transfer mold 100 which has the upper mold half 100a modified to the geometry of the pre-molded die attach cavity area 10 then encapsulating the lead frame 29 with thermoset molding compound. When the lead frame 29 is positioned in the ejection or transfer mold 100, the die paddle 12 rests directly against the modified portion of the closed upper half mold 100a surface of the ejection or transfer mold 100. Therefore, to avoid over-coating the interconnection area 16 with plastic material, the die paddle 12 must be securely positioned and maintained adjacent the upper half mold 100a surface of the ejection or transfer mold 100 during molding process. Following the encapsulation process, the a ejection or transfer mold 100 is opened and pre-molded package plastic body 13 is normally but not necessarily cured through a post mold cure process.

Figure 2:
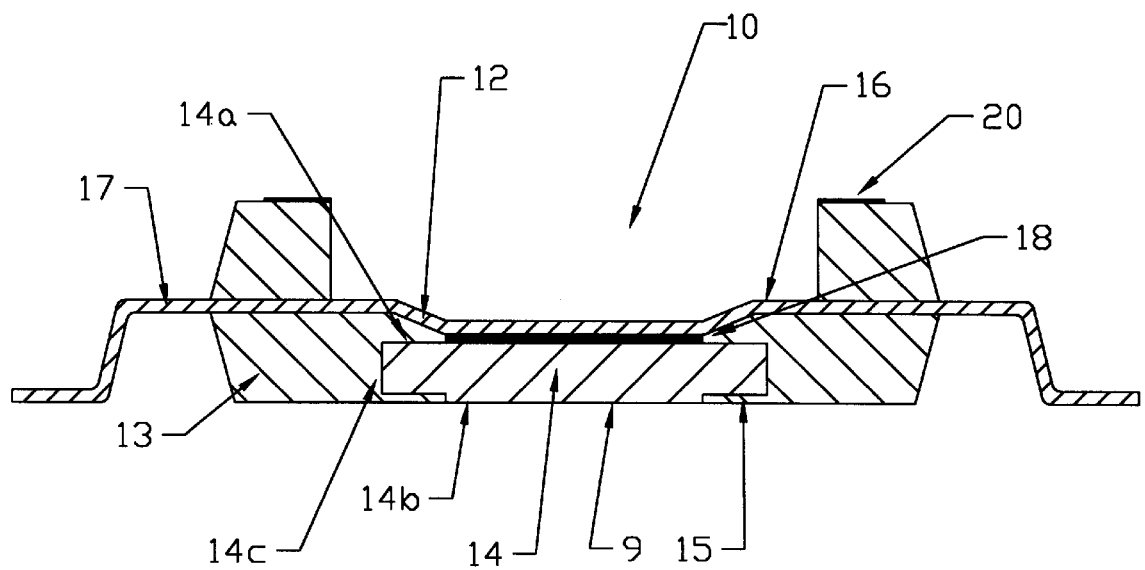
FIG. 2 is a sectional view of a pre-molded plastic package illustrating an alternate embodiment of the invention and a partial electromagnetic radiation shield.

For purposes of simplicity and clarity of illustration, the invention is described herein with reference to the pre-molded plastic package body 13 configuration generally described as but not limited to a quad flatpack which has gullwing leads as shown in FIG. 2 extending from all four lateral smooth flat surfaces, the pre-molded die attach cavity area 10 which provides area for semiconductor circuit 8 attachment, reduction of dielectric constant, and interconnection area 16, the metal-to-plastic junction 14c provides a direct leakage path from the exterior of the package into the internal cavity, permitting leakage of water vapor and the like into the cavity. To minimize such leakage, the edge surfaces of the body 14 are not perpendicular to surfaces 14a and 14b. Instead, the edge surfaces are irregular and preferably include at least one inwardly extending retaining flange 15 which increases the length of the metal-to-plastic junction 14c to at least twice the distance separating surfaces 14a and 14b. Multiple flanges could, of course, be used. Heat spreader interface 18 consists of using adhesive, pressure sensitive foil, or aluminum oxide filled thermal grease or the like at heat spreader interface.

It will be observed that when the pre-molded package plastic body 13 is formed around the metal body 14, the metal-to-plastic junction 14c along the edges of the metal body 14 is contorted and extended so that the path along the metal-to-plastic junction 14c from the external surface of the package to the internal surface 14a of metal body 14 is at least twice as long as the distance separating parallel faces 14a and 14b. By including inwardly extending retaining flange 15 on metal body 14, the potential leakage path formed by the metal-to-plastic junction is thus elongated and contorted. The likelihood of leakage is therefore greatly reduced. By making the edge surface of metal body 14 which defines the junction irregular, contact is formed between the metal body 14 and the pre-molded package plastic body 13 which greatly enhances the structural integrity of the package unit formed. Since the metal-to-plastic junction 14c is formed by contact sections of metal and plastic, the danger of leakage because of mismatched coefficients of thermal expansion is also greatly reduced. The package unit is thus much less susceptible to damage or leakage caused by mechanical stress. Accordingly, in the structure of FIG. 4 the pre-molded package plastic body 13 has means to directly conduct heat from the semiconductor circuit 8 to an exposed surface 14b which is nickel or other barrier metal 9 while maintaining the integrity of the package so that the likelihood of water vapor leakage into the package is substantially reduced and thermal oxide formation on surface 14b is prevented.

It should be noted that the invention is not limited to use of metals for the heat transfer metal body 14 or metal body 19. Various other materials such as ceramics and the like may be used. Even though ceramics generally exhibit coefficients of thermal conductivity which are considerably less than that of most metals, their coefficients of thermal conductivity are at least an order of magnitude greater than that of most plastic materials used for forming plastic packages. Furthermore, ceramics generally exhibit coefficients of thermal expansion which are more compatible with plastic bodies than that of metals. Therefore, adequate ceramic-to-plastic seals are more readily formed than metal-to-plastic seals. Accordingly, for purposes of this disclosure, such terms as "heat transfer body" and "thermally conductive body" are used to mean any body of material having a coefficient of thermal conductivity greater than $1 \times 10^{-6}$ cal./cm. °C. whether the body is metal, ceramic or otherwise.

In the alternate embodiment illustrated in FIG. 3, the invention is described herein with reference to the pre-molded plastic package body 13 configuration generally described as but not limited to a quad flatpack which has gullwing leads extending from all four lateral smooth flat surfaces, the pre-molded die attach cavity area 10 which provides area for semiconductor circuit 8 attachment and reduction of dielectric constant, die paddle 12, pre-molded package plastic body 13, interconnection area 16, terminal leads 17, seal area 20 and support pin holes 31. The structure is formed by placing the lead frame 29 containing the die paddle 12 and lead frame tie bars 32 into a ejection or transfer mold 100 which has the upper mold half 100a modified to the geometry of the pre-molded die attach cavity area 10 then encapsulating the lead frame 29 with thermoset molding compound. When the lead frame is positioned in the ejection or transfer mold 100, the die paddle 12 rests directly against the modified upper mold half 100a surface of the closed ejection or transfer mold 100. Therefore, to avoid over-coating the interconnection area 16 with plastic material, the die paddle 12 and terminal leads 17 are supported by support pins 31 securely positioned and maintained in the lower mold half 100b of the ejection or transfer mold 100 during molding process. Following the encapsulation process, the a ejection or transfer mold 100 is opened and pre-molded package plastic body 13 is normally but not necessarily cured through a post mold cure process.

In the alternate embodiment illustrated in FIG. 4, an electronic semiconductor circuit 8 is secured to the opposite surface of die paddle 12 in the pre-molded die attach cavity area 10 which provides area for semiconductor circuit 8 attachment and reduction of dielectric constant, and then conventional interconnections such as wire leads 24 from the semiconductor circuit 8 to the package input/output terminal leads 17 are attached, then a generally orthogonal metal body 14 of thermally conductive material such as copper or the like is plated with a nickel or other barrier plated metal 9 secured to the lower-side of the semiconductor circuit 8 on a conventional lead frame using adhesive, pressure sensitive foil, or aluminum oxide filled thermal grease or the like at heat spreader interface 14a. Metal body 14 may, of course, be circular in plan dimensions or may be in any other geometric form desired or compatible with the package design. Heat spreader interface 14a may be any suitably thermally conductive material. Where electrical isolation between semiconductor circuit 8 and metal body 14 is required, the heat spreader interface 14a should be a suitably electrically non-conductive material. Alternatively, where electrical continuity between the semiconductor circuit 8 and metal body 14 is acceptable or required, an electrically conductive material may be used or the metal body 14 may be otherwise secured to the lower-side of the semiconductor circuit 8. Obviously, various other means of securing the metal body 14 to the lower-side of the semiconductor circuit 8 may be used as necessary to satisfy the electrical requirements of the package. Seal area 20 of pre-molded package plastic body 13 provides the mounting surface for attachment of seal lid 21 to the pre-molded package plastic body 13. Seal lid 21 maybe constructed of plastic, ceramic, metal, or optically transmissive materials and is attached to pre-molded package plastic body 13 seal area 20 by using a variety of epoxy adhesives.

It will be observed that when the pre-molded package plastic body 13 is formed around the metal body 14, the metal-to-plastic junction 14c along the edges of the metal body 14 is contorted and extended so that the path along the metal-to-plastic junction 14c from the external surface of the pre-molded package plastic body 13 to the internal surface 14a of metal body 14 is at least twice as long as the distance separating parallel surfaces 14a and 14b. By including inwardly extending retaining flange 15 on metal body 14, the potential leakage path formed by the metal-to-plastic junction is thus elongated and contorted. The likelihood of leakage is therefore greatly reduced. By making the edge surface of metal body 14 which defines the junction irregular, contact is formed between the metal body 14 and the pre-molded package plastic body 13 which greatly enhances the structural integrity of the package unit formed. Since the metal-to-plastic junction 14c is formed by sections of metal and plastic, the danger of leakage because of mismatched coefficients of thermal expansion is also greatly reduced. The package unit is thus much less susceptible to damage or leakage caused by mechanical stress. Accordingly, in the structure of FIG. 4 the pre-molded package plastic body 13 has means to directly conduct heat from the semiconductor circuit 8 to an exposed surface 14b while maintaining the integrity of the package so that the likelihood of water vapor leakage into the package is substantially reduced.

Figure 5:
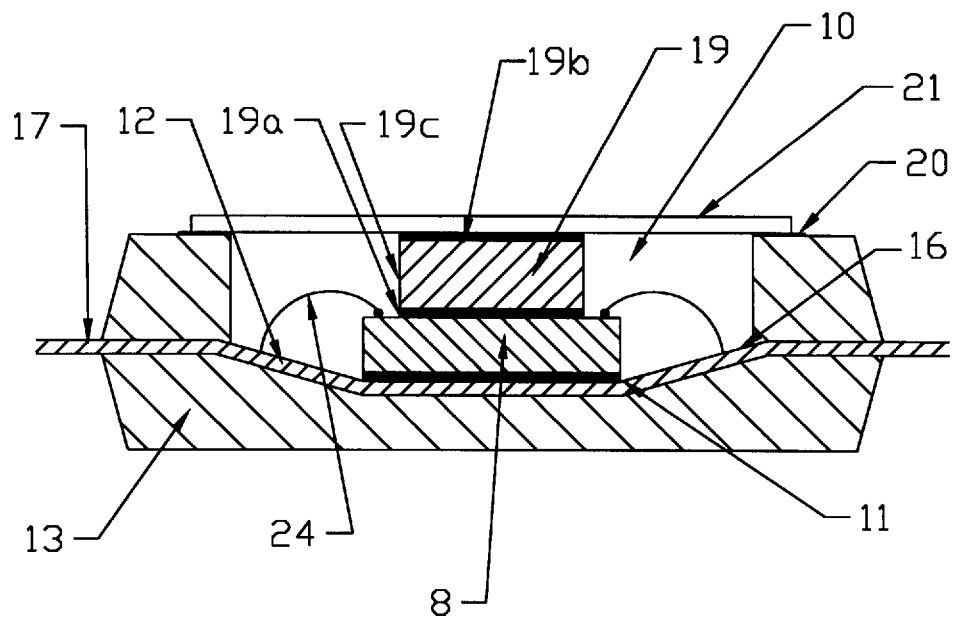
FIG. 5 is a sectional view of a plastic package illustrating an alternative embodiment of the invention including die paddle, lead frame, and a partial electromagnetic radiation shield.

In the alternate embodiment illustrated in FIG. 5, an electronic semiconductor circuit 8 is secured to the opposite surface of die paddle 12 in the pre-molded die attach cavity area 10 which provides area for semiconductor circuit 8 attachment and reduction of dielectric constant, and then conventional interconnections such as wire leads 24 from the semiconductor circuit 8 to the pre-molded package plastic body 13 input/output terminal leads 17 are attached, then a generally orthogonal metal body 19 of thermally conductive material such as copper or the like is plated with a nickel or other barrier plated metal 9 secured to the upper-side of the semiconductor circuit 8 on a conventional lead frame using adhesive, pressure sensitive foil, or aluminum oxide filled thermal grease or the like at heat spreader interface 19a. Metal body 19 may, of course, be circular in plan dimensions or may be in any other geometric form desired or compatible with the package design. Heat spreader interface 19a may be suitable thermally conductive material. Where electrical isolation between semiconductor circuit 8 and metal body 19 is required, the heat spreader interface 19a should be a suitably electrically non-conductive material. Alternatively, where electrical continuity between the semiconductor circuit 8 and metal body 19 is acceptable or required, an electrically conductive material may be used or the metal body 19 may be otherwise secured to the upper-side of the semiconductor circuit 8. Obviously, various other means of securing the metal body 19 to the upper-side of the semiconductor circuit 8 may be used as necessary to satisfy the electrical requirements of the package.

In order to ensure that the outer surface of the metal body 19 is properly oriented prior to lid seal procedure, the metal body 19 should be securely affixed to the upper-side of the semiconductor circuit 8. As shown in FIG. 5, the metal body 19 has first and second oppositely disposed major surfaces 19a and 19b. Surface 19b is positioned to be coplanar with and thus forms an integral portion of the pre-molded package plastic body 13 seal lid 21 that secures to seal area 20. Seal area 20 of pre-molded package plastic body 13 provides the mounting surface for attachment of seal lid 21 to the pre-molded package plastic body 13. Seal lid 21 maybe constructed of plastic, ceramic, metal or materials and is attached to pre-molded package plastic body 13 seal area 20 and surface 19b by using a variety of epoxy adhesives.

It will be observed that since the metal body 19 is connected directly to the upper-side of the semiconductor circuit 8 and extends to the seal lid 21 of the pre-molded package plastic body 13, heat can be conducted through the metal body 19 directly from the upper-side of semiconductor circuit 8 to lid 21 and rapidly dissipated by connecting an external heat sink or the like in thermal communication with seal lid 21.

Figure 6:
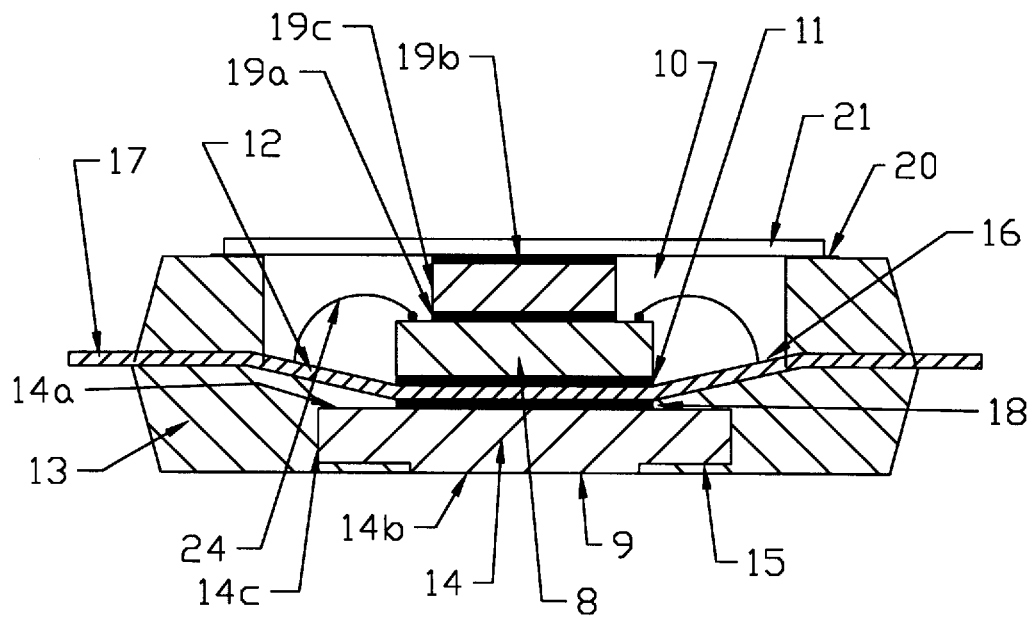
FIG. 6 is a sectional view of a plastic package illustrating an alternative embodiment of the invention including die paddle, lead frame, and a partial electromagnetic radiation shields.

In the alternate embodiment illustrated in FIG. 6, after the semiconductor circuit 8 is secured to the die paddle 12 in the pre-molded die attach cavity area 10 which provides area for semiconductor circuit 8 attachment and reduction of dielectric constant, and the semiconductor circuit 8 connected to the terminal leads 17 by wires 24, the construction techniques described in FIG. 4 and FIG. 5 above produce heat spreader metal body 14 and heat spreader metal body 19 are shown in pre-molded package plastic body 13. This arrangement produces two sources for heat extraction directly from semiconductor circuit 8, one from the upper-side surface 19a through heat spreader metal body 19 to surface 19b and to seal lid 21b, and the other from underside of die paddle 12 surface 14a through heat spreader metal body 14 to surface 14b.

It will be noted that when FIG. 6 construction techniques are employed a near EMI shield is produced around the semiconductor circuit 8.

As the functional complexities of semiconductor circuits increase, it is sometimes necessary or advantageous to provide ground planes, internal busses or the like between contact pads on the semiconductor circuit in the device package itself. Similarly, where a semiconductor circuit having standardized input/output pad orientations is adapted to a package having incompatible input/output leads, a device known as a rerouting board is sometimes included within the device package. A rerouting board or the like is essentially a miniature circuit board which provides electrical communication paths within the package and reorients the input/output pads to be compatible with the frame leads of the device package. Ordinarily, such rerouting boards are either ceramic substrates or polyimide boards or the like. Unfortunately, polyimide boards, when encased in a plastic package, tend to de-laminate. Furthermore, since the material of the rerouting board is different from that of the encasement plastic, a difference in coefficients of thermal expansion may cause fracturing or delamination of the rerouting board and components mounted thereon. Temperature related problems associated with such rerouting boards become extremely acute in devices which generate excessive amounts of thermal energy.

Figure 7:
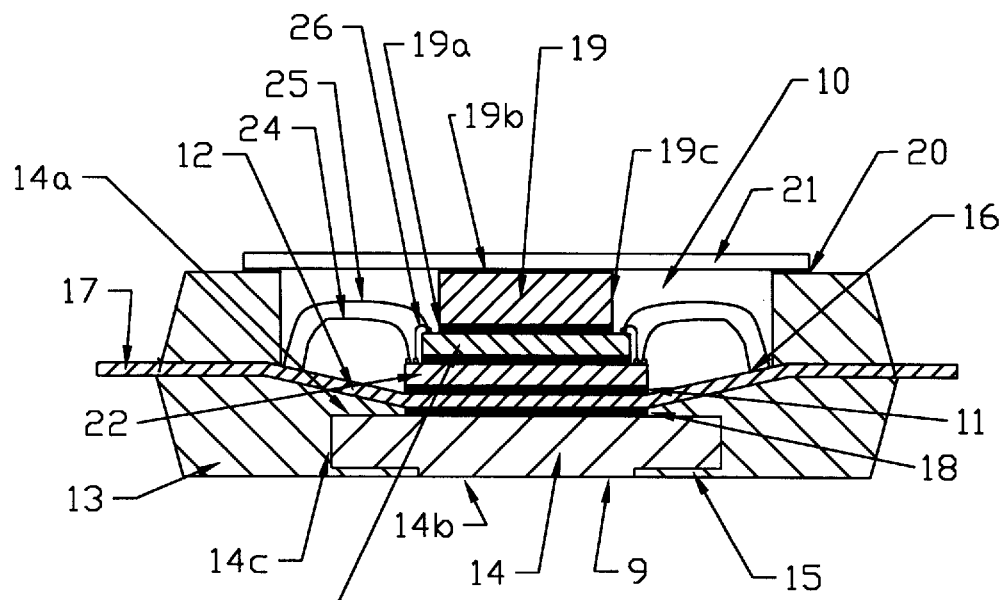
FIG. 7 is a sectional view of a plastic package illustrating an alternate embodiment of the invention including a rerouting board and a partial electromagnetic radiation shields.

In the alternate embodiment illustrated in FIG. 7 after the semiconductor circuit 8 is secured to rerouting board 22 mounted on die paddle 12 and the semiconductor circuit 8 connected to the terminal leads 17 by wires 25 or rerouting board 22 by wires 24 and rerouting board 22 to semiconductor circuit 8 by wires 26, the construction techniques described in FIG. 4 and FIG. 5 above produce heat spreader metal body 14 and heat spreader metal body 19 to seal lid 21 are shown in pre-molded package plastic body 13. This arrangement produces two sources for heat extraction directly from semiconductor circuit 8, one from the upper-side surface 19a through heat spreader metal body 19 to surface 19b and seal lid 21, and the other from underside of die paddle 12 to surface 14a through heat spreader metal body 14 to surface 14b.

As illustrated in FIG. 7, the thermal problems of the rerouting board are solved by fabricating the rerouting board from material which is the same as or closely approximates the material of the semiconductor circuit 8. For example, as illustrated in FIG. 7 rerouting board 22 is a high resistivity silicon substrate on which circuit paths are suitably formed by diffusion, electroplating, deposition or the like. The semiconductor circuit 8 is suitably secured to the rerouting board 22 and the interconnection contact pads of semiconductor circuit 8 connected to the contact pads of the rerouting board 22 by wires 26 or to terminal leads 17 by wires 25. Similarly, wires 24 connect the contact pads of the rerouting board 22 to the terminal leads 17. Since the rerouting board 22 is formed of the same material as the semiconductor circuit 8, mismatches in coefficient of thermal expansion are avoided.

It will be recognized that the semiconductor circuit 8 and rerouting board 22 structure shown in FIG. 7 may be utilized as the semiconductor circuit 8 in any of the structures shown in FIGS. 4, 5, 6, or 9. Accordingly, since the rerouting board 22 is formed of silicon, the composite rerouting board 22 and semiconductor circuit 8 may be used as desired in any of the package configurations disclosed herein by simply substituting the combination of semiconductor circuit 8 and rerouting board 22 for semiconductor circuit 8 in any of the other configurations.

Figure 8:
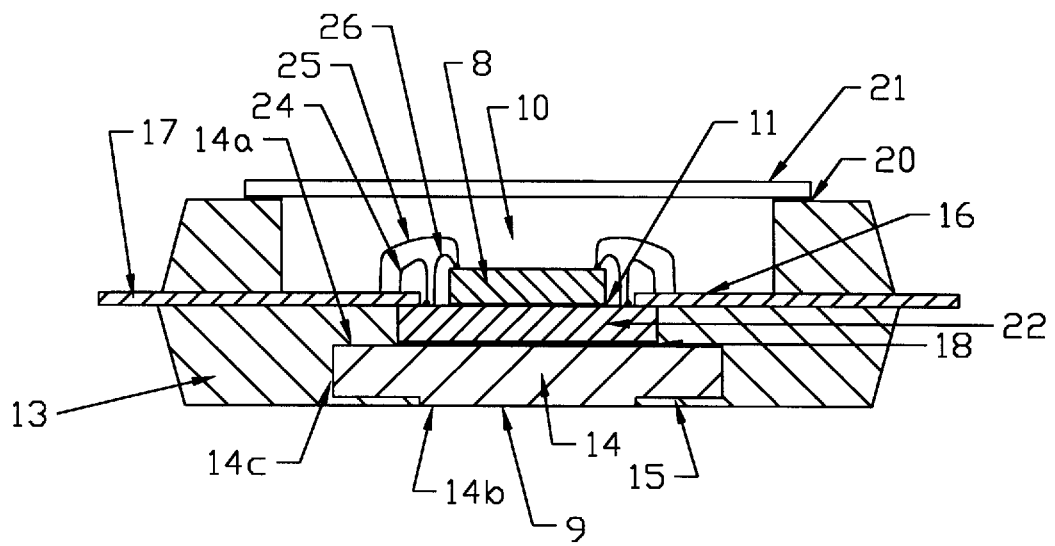
FIG. 8 is a sectional view of a plastic package illustrating an alternate embodiment of the invention including a rerouting board and a partial electromagnetic radiation shield.

In the alternate embodiment illustrated in FIG. 8 after the semiconductor circuit 8 is secured to rerouting board 22 and semiconductor circuit 8 connected to the terminal leads 17 by wires 26 or rerouting board 22 by wires 25 and rerouting board 22 to terminal leads 17 by wires 25, the construction techniques described in FIG. 4 above produce heat spreader metal body 14 is shown molded in pre-molded package plastic body 13. This arrangement produces one source for heat extraction directly form semiconductor circuit 8 from underside of rerouting board 22 surface 14a through heat spreader metal body 14 to surface 14b and an environment in which the semiconductor circuit 8 can be sealed in an air dielectric medium.

Figure 9:
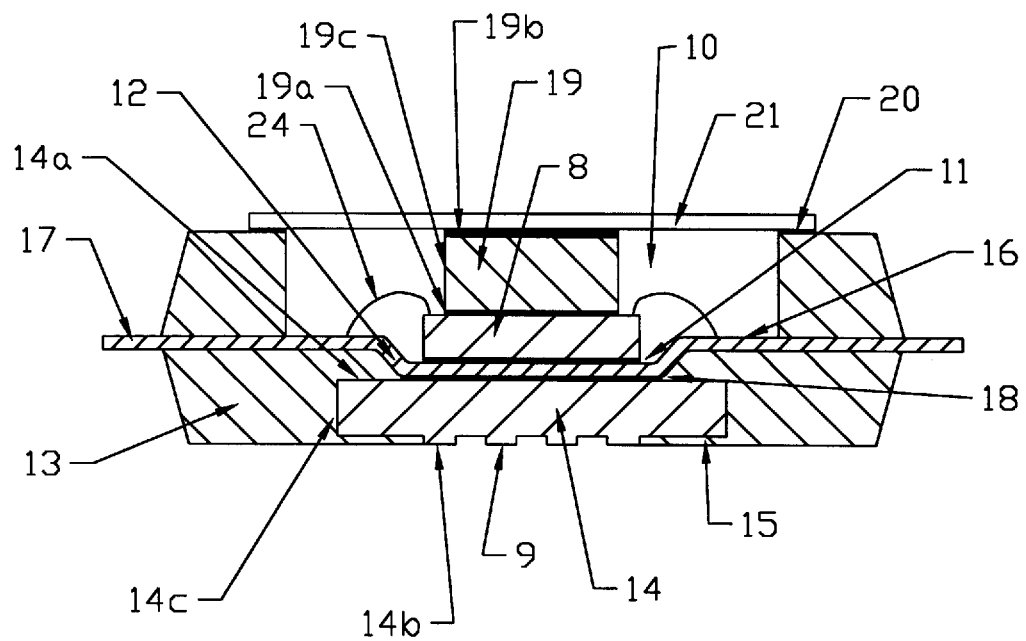
FIG. 9 is a sectional view of a plastic package illustrating an alternate embodiment of the invention in which the heat transfer body has improved surface area and a partial electromagnetic radiation shield.

In the alternate embodiment illustrated in FIG. 9 after the semiconductor circuit 8 is secured to die paddle 12 and the semiconductor circuit 8 connected to the terminal leads 17 by wires 24, the construction techniques described in FIG. 4 and FIG. 5 above produce heat spreader metal body 14 and heat spreader metal body 19 are shown in pre-molded package plastic body 13. This arrangement produces two sources for heat extraction directly from semiconductor circuit 8, one from the upper-side surface 19a through heat spreader metal body 19 to surface 19b then to seal lid 21, and the other from underside of semiconductor circuit 8 surface 14a through heat spreader metal body 14 to surface 14b. Arrangement of the additional surface area provides for ejection molding without allowing mold flash or molding compound to penetrate additional surface edges thereof and which is adapted to be surface mounted. This arrangement produces surface 14b of metal body 14 for direct heat extraction from semiconductor circuit 8 or mounting of external terminal lead configuration for improved thermal extraction from semiconductor circuit 8. Surface 14b of metal body 14 also provides adequate planar surface area for subsequent handling operations i.e.., pick and placement for surface mount applications and the like. Addition of external air flow or liquid cooling medium onto surface 14b of metal body 14 of pre-molded package plastic body 13 will provide additional thermal extraction directly from the semiconductor circuit 8.

Figure 10:
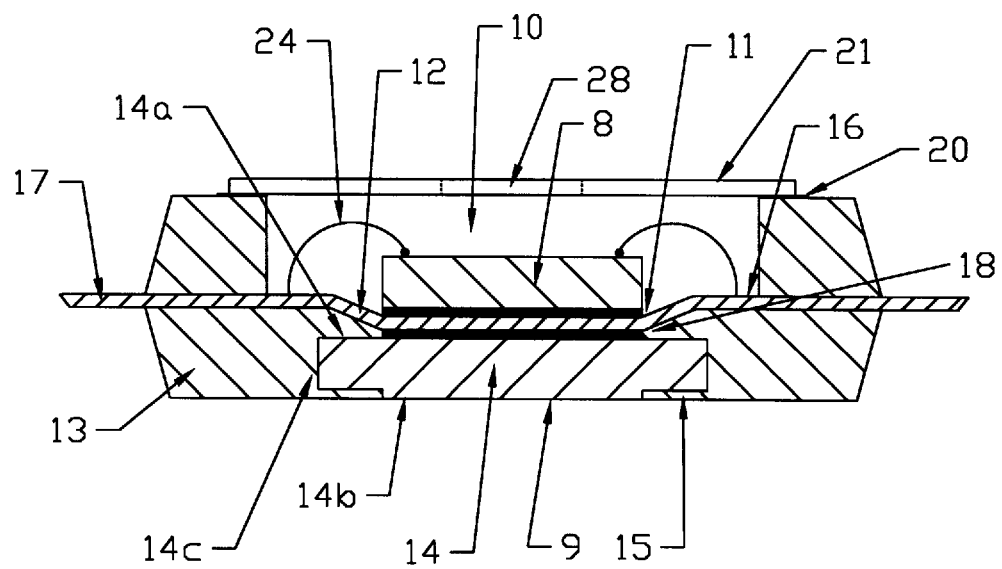
FIG. 10 is a sectional view of a pre-molded plastic package illustrating an alternative embodiment of the invention including die paddle, lead frame, optical lens, and a partial electromagnetic radiation shield.

In the alternate embodiment illustrated in FIG. 10 illustrates an embodiment of the invention wherein the heat transfer of heat spreader body metal 14 is enhanced by increasing surface area of surface 14b of metal body 14 that forms a surface of pre-molded package plastic body 13. Arrangement of the additional surface area provides for ejection molding without allowing mold flash or molding compound to penetrate additional surface edges thereof and which is adapted to be surface mounted. This arrangement produces surface 14b of metal body 14 for direct heat extraction from semiconductor circuit 8 or mounting of external terminal lead configuration for improved thermal extraction from semiconductor circuit 8. Surface 14b of metal body 14 also provides adequate planar surface area for subsequent handling operations i.e.., pick and placement for surface mount applications and the like. Addition of external air flow or liquid cooling medium onto surface 14b of metal body 14 of pre-molded package plastic body 13 will provide additional thermal extraction directly from the semiconductor circuit 8. The seal lid 21 also contains the optical lens 28 as an integral part of seal lid 21. The optical lens 28 provides the path for ultra violet, infrared, or optical rays to penetrate from the pre-molded package plastic body 13 to the external environment.

Figure 11:
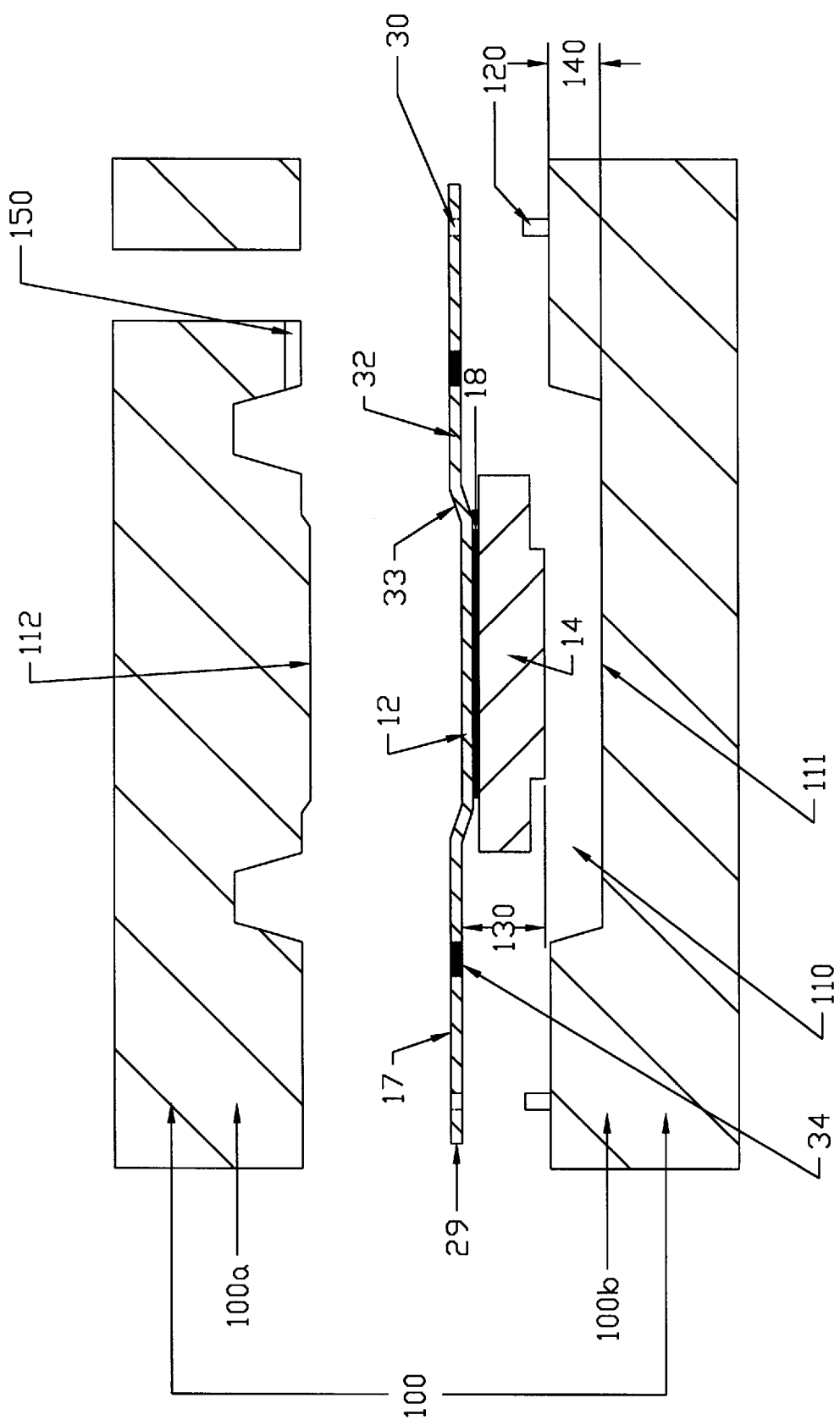
FIG. 11 is a sectional view of a open transfer mold illustrating an alternative embodiment of the invention including die paddle, lead frame, heat transfer body, and a partial electromagnetic radiation shield.

In the alternate embodiment illustrated in FIG. 11 illustrates an embodiment of the invention which shows a plan view of the lead frame 29. The lead frame 29 is comprised of a die paddle 12, terminal leads 17, alignment holes 30, and lead frame tie bars 32. Alignment holes 30 are formed at spaced apart locations in the lead frame 29. The die paddle 12 is formed in the center of the lead frame 29. The die paddle 12 is attached to surface 18 of metal body 14. Tie bars 32 connect the die paddle 12 to the lead frame 29. Tie bar downset 33 facilitate flexure of the tie bars 32. The terminal leads 17 are formed circumferentially around the die paddle 12. The terminal leads 17 extend from the lead frame 29 toward the die paddle 12, but they do not touch it. This is so that in the finished pre-molded package plastic body 13 the terminal leads 17 may be electrically isolated from the die paddle 12. This electrical isolation is accomplished, after the semiconductor circuit 8 is attached, interconnected, sealed, and by dam bar removal of the lead frame 29, leaving extended and unconnected terminal leads 17 and tie bars 32. Bond wires 24, 25, or 26 connect the interior end of each of the terminal leads 17 to selected semiconductor circuit 8 interconnection pads, providing electrical connection from the semiconductor circuit 8 to electrical components outside the package.

FIG. 11 shows a cross sectional view of the heat spreader metal body 14, lead frame 29, disposed in the mold cavity 110 of an ejection or transfer mold 100. In one method of forming the pre-molded package plastic body 13 with heat spreader, the heat spreader metal body 14 is attached to the die paddle 12 of lead frame 29 creating interface 18. The lead frame 29, die paddle 12, tie bar 32, and heat spreader metal body 14 are then placed in the mold cavity 110, as shown in FIG. 11, so that surface 14b of the heat spreader metal body 14 contacts lower mold half 100b contact surface 111. The lead frame 29 is mounted to the lower mold half 100b by placing the lead frame alignment holes 30 of the lead frame 29 over the mold alignment pins 120.

The two mold halves 100a, 100b of ejection or transfer mold 100 are closed together. The lead frame 29 with attached heat spreader metal body 14 height 130 is greater than the corresponding lower mold half height 140 of the mold cavity 110. Therefore, when the two mold halves 100a, 100b are fully closed together, the die paddle 12 will be pushed upward, causing the tie bars 32 to be bent upward. This upward pull on the tie bars 32 gives rise to tensile forces which act to pull down the end of the tie bars 32 adjacent the die paddle 12. Consequently, the heat spreader metal body 14 is forced against lower mold half 100b surface 111 so that it is held in place and the die paddle 12 is forced against upper mold half 100a surface 112. Further, due to the tight seal between the heat spreader metal body 14 and the lower mold half 100b surface 111 and the die paddle 12 and upper mold half 100a surface 112, no encapsulant enters the region between those two surfaces so that no bleed or flash will form on the surface 14b or die paddle 12 when the encapsulant solidifies. Bleed and flash are minimized, too, because of the development of encapsulant compounds with better characteristics (e.g., lower viscosity, better fillers) than those previously used and because of the implementation of computer control of molding parameters (e.g., compound velocity, transfer pressure, etc.).

After the ejection or transfer mold 100 is closed, encapsulant is transferred into the mold cavity 110 through the encapsulant channel 150 until the cavity 110 is full. When the encapsulant solidifies, the ejection or transfer mold 100 is opened and pre-molded package plastic body 13 is removed and normally but not necessarily cured through a post mold cure process.

Figure 12:
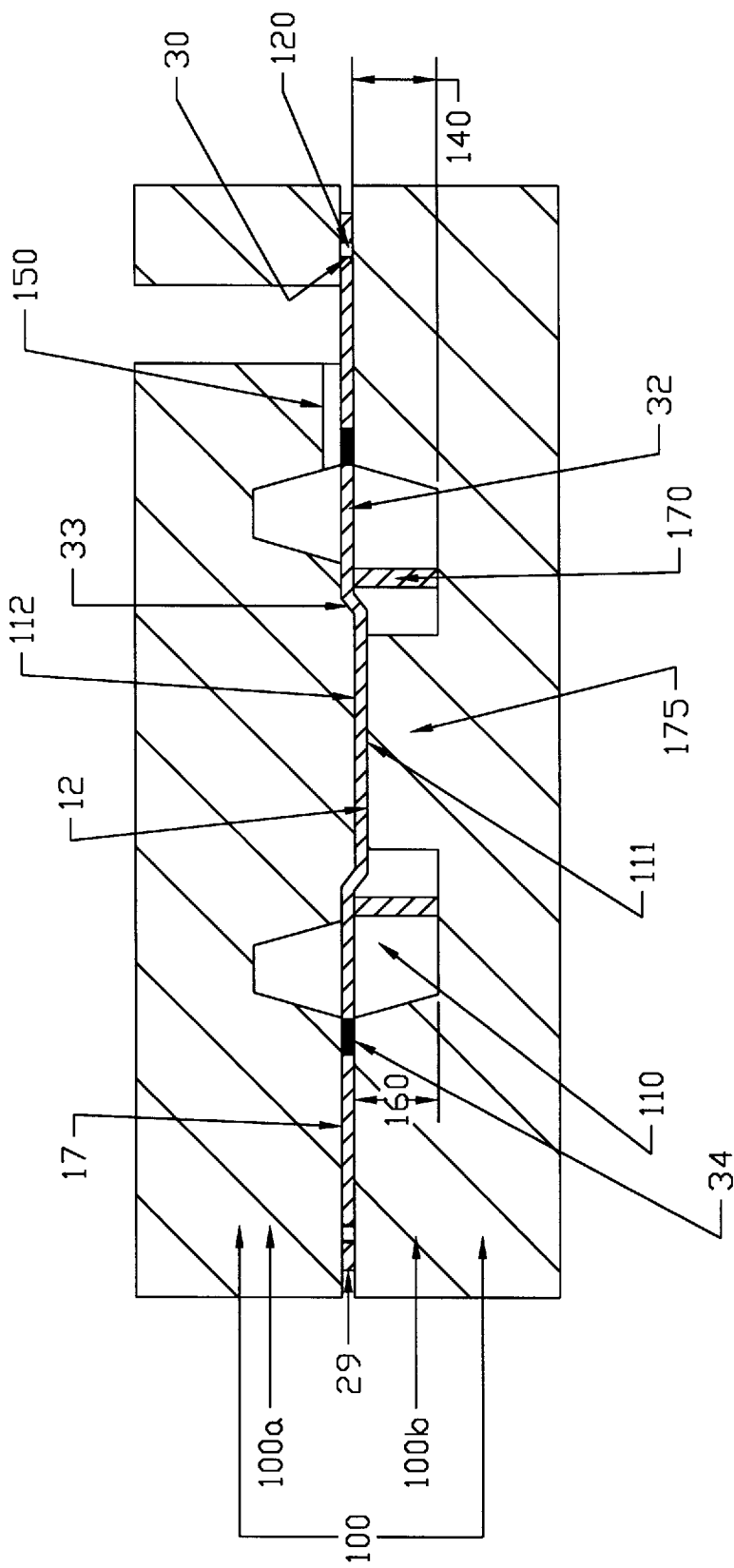
FIG. 12 is a sectional view of a closed transfer mold illustrating an alternative embodiment of the invention including die paddle, lead frame, and support pins.

In the alternate embodiment illustrated in FIG. 12 illustrates an embodiment of the invention which shows a plan view of the lead frame 29. The lead frame 29 is comprised of a die paddle 12, terminal leads 17, alignment holes 30, and lead frame tie bars 32. Alignment holes 30 are formed at spaced apart locations in the lead frame 29. The die paddle 12 is formed in the center of the lead frame 29 and tie bars 32 connect the die paddle 12 to the lead frame 29. Tie bar downset 33 facilitate flexure of the tie bars 32. The terminal leads 17 are formed circumferentially around the die paddle 12. The terminal leads 17 extend from the lead frame 29 toward the die paddle 12, but they do not touch it. This is so that in the finished pre-molded package plastic body 13 the terminal leads 17 may be electrically isolated from the die paddle 12. This electrical isolation is accomplished, after the semiconductor circuit 8 is attached, interconnected, sealed, and by dam bar 34 removal of the lead frame 29, leaving extended and unconnected terminal leads 17 and tie bars 32. Bond wires 24, 25, or 26 connect the interior end of each of the terminal leads 17 to selected semiconductor circuit 8 interconnection pads, providing electrical connection from the semiconductor circuit 8 to electrical components outside the package.

FIG. 12 shows a cross sectional view of lead frame 29, disposed in the mold cavity 110 of ejection or transfer mold 100. In one method of forming the pre-molded package plastic body 13, the terminal leads 17 are attached to the die paddle 12 of lead frame 29. The lead frame 29, die paddle 12, and tie bars 32, are then placed in the mold cavity 110, as shown in FIG. 12, so that terminal leads 17 of the lead frame 29 are supported by lead frame support pins 170 and die paddle 12 of the lead frame 29 is supported by die paddle or rerouting board support 175 of lower mold half 100b. The lead frame 29 is mounted to the lower mold half 100b by placing the lead frame alignment holes 30 of the lead frame 29 over the mold alignment pins 120.

The two mold halves 110a, 100b of ejection or transfer mold frame height 160 is greater than the corresponding lower mold half height 140 of the mold cavity 110. Therefore, when the two mold halves 100a, 100b are fully closed together, the die paddle 12 is held against upper mold half 100a surface 112 and terminal leads 17 will be pushed upward, causing the tie bars 32 to be bent upward. This upward pull on the tie bars 32 gives rise to tensile forces which act to pull down the end of the tie bars 32 adjacent the die paddle 12. Consequently, the terminal leads 17 are forced against the support pins 170 so that they are held in place. Further, due to the tight seal between the die paddle 12 and the lower mold half 100b surface 111 and the die paddle 12 and upper mold half 100a surface 112, no encapsulant enters the region between those two surfaces so that no bleed or flash will form on the surface on die paddle 12 when the encapsulant solidifies. Bleed and flash are minimized, too, because of the development of encapsulant compounds with better characteristics (e.g., lower viscosity, better fillers) than those previously used and because of the implementation of computer control of molding parameters (e.g., compound velocity, transfer pressure, etc.).

After the ejection or transfer mold 100 is closed, encapsulant is transferred into the mold cavity 110 through the encapsulant channel 150 until the mold cavity 110 is full. When the encapsulant solidifies, the ejection or transfer mold 100 is opened and the completed pre-molded package plastic body 13 is removed and normally but not necessarily cured through a post mold cure process.

Figure 13:
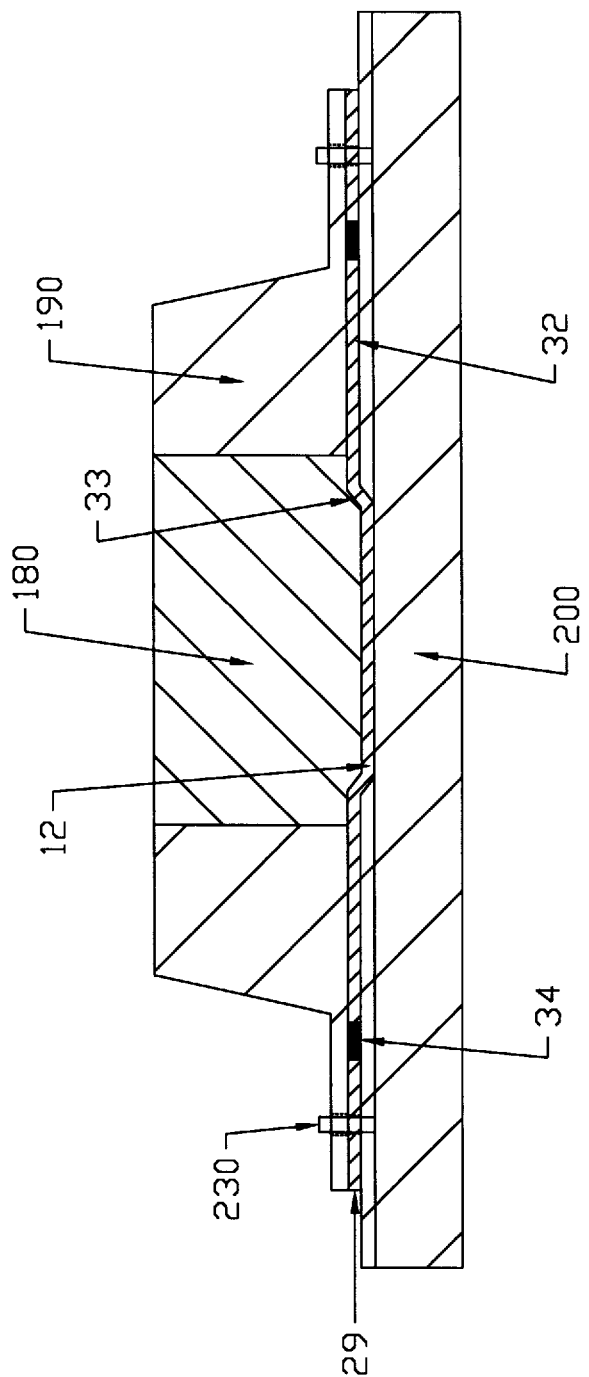
FIG. 13 is a sectional view of a casting fixture illustrating an alternate embodiment of the invention including die paddle, lead frame, and pre-cast die attach spacer.

FIG. 13 shows a cross sectional view of lead frame 29 with die paddle 12, tie bars 33, and dam bar 34 disposed in casting fixture upper half 190 and in casting fixture lower half 200. Lead frame 29 with die paddle 12 is placed into position using casting fixture alignment pins 230 of casting fixture lower half 200. Casting fixture upper half 190 is placed over lead frame 29 with die paddle 12 using casting fixture alignment pins 230 of casting fixture lower half 200. In one method of forming the pre-cast die attach cavity spacer 180, a material such as but limited to silicone rubber is cast into FIG. 13 to form the pre-cast die attach cavity spacer 180. Casting fixture upper half 190 is removed to expose lead frame 29 with die paddle 12 and pre-cast die attach cavity spacer 180. This structure, lead frame 29 with die paddle 12 and pre-cast die attach cavity spacer 180, is now ready for ejection or transfer mold 100 to produce a pre-molded package plastic body 13 as described in FIG. 15.

Figure 14:
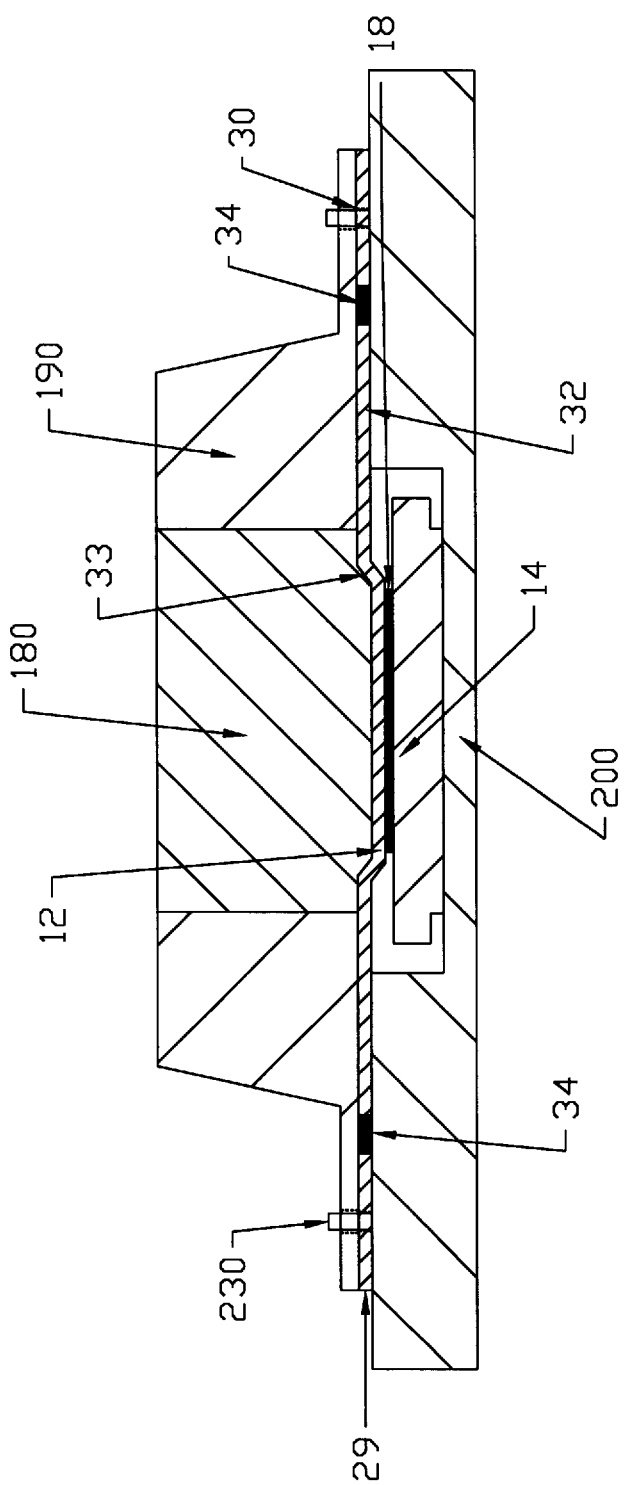
FIG. 14 is a sectional view of a casting fixture illustrating an alternate embodiment of the invention including die paddle, lead frame, pre-cast die attach spacer, heat transfer body, and a partial electromagnetic radiation shield.

FIG. 14 shows a cross sectional view of lead frame 29 with die paddle 12, tie bars 33, dam bar 34, and metal body 14 disposed in casting fixture upper half 190 and in casting fixture lower half 200. Lead frame 29 with die paddle 12 and metal body 14 is placed into position using casting fixture alignment pins 230 of casting fixture lower half 200. Casting fixture upper half 190 is placed over lead frame 29 with die paddle 12 and metal body 14 using casting fixture alignment pins 230 of casting fixture lower half 200. In one method of forming the pre-cast die attach cavity spacer 180, a material such as but limited to silicone rubber is cast into FIG. 14 to form the pre-cast die attach cavity spacer 180. Casting fixture upper half 190 is removed to expose lead frame 29 with die paddle 12, metal body 14, and pre-cast die attach cavity spacer 180. This structure, lead frame 29 with die paddle 12, metal body 14, and pre-cast die attach cavity spacer 180, is now ready for ejection or transfer mold 100 to produce a pre-molded package plastic body 13 as described in FIG. 15.

Figure 15:
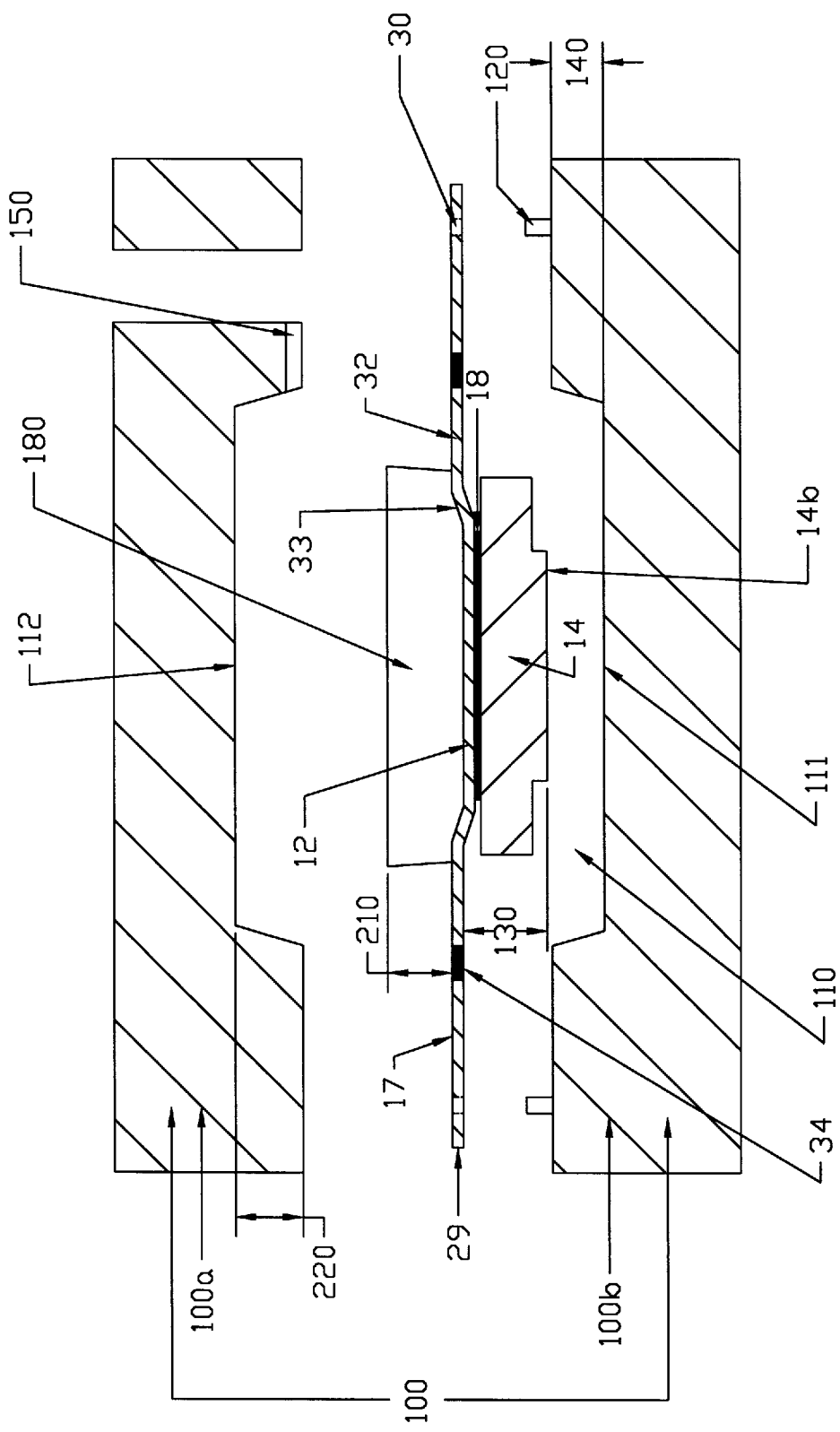
FIG. 15 is a sectional view of a open transfer mold illustrating an alternative embodiment of the invention including die paddle, lead frame, pre-cast die attach spacer, heat transfer body, and a partial electromagnetic radiation shield.

FIG. 15 shows a cross sectional view of lead frame 29 with die paddle 12, tie bars 33, dam bar 34, and metal body 14 disposed in ejection or transfer mold 100 and with mold upper half 100*a* and mold lower half 100*b*. Lead frame 29 with die paddle 12 and metal body 14 is placed into position using ejection mold alignment pins 120 of ejection or transfer mold 100 lower mold half 100*b*. When ejection or transfer mold 100 mold upper half 100*a* closes onto lower mold half 100*b*, pre-cast die attach cavity spacer height 210 is greater than lead frame with attached heat spreader height 130. This height difference compresses the pre-cast die attach cavity spacer 180 against ejection or transfer mold 100 cavity upper mold half 100*a* surface 112 and against upper surface of lead frame die paddle 12 so no encapsulant enters the region between those two surfaces therefore, that no bleed or flash will form on the surface 14*b* or die paddle 12 when the encapsulant solidifies. Bleed and flash are minimized, too, because of the development of encapsulant compounds with better characteristics (e.g., lower viscosity, better fillers) than those previously used and because of the implementation of computer control of molding parameters (e.g., compound velocity, transfer pressure, etc.).

After the ejection or transfer mold 100 process is complete, the ejection or transfer mold 100 is opened to expose the pre-molded package plastic body 13 which contains pre-cast die attach cavity spacer 180. Next, the package structure is lifted from lower mold half 100*b* and then the pre-cast die attach cavity spacer 180 is removed from the pre-molded package plastic body 13 leaving lead frame 29, die paddle 12, tie bars 33, dam bar 34, and metal body 14. Pre-molded package plastic body 13 is normally but not necessarily cured through a post mold cure process.

The external terminal lead configuration, however, is not significant to the invention other than to limit the surface area and location on the package which may be used for attaching heat sinks for heat extraction. The packages illustrated herein are configured so that the heat conductive body presents a flat surface parallel, even coplanar with one surface of the quad flatpack plastic package, or an improved thermally conductive surface. It will be readily recognized, however, that the principles of the invention may also be applied to produce packages of other designs and packages wherein the outer surface of the heat conductive body is not coplanar with the surface of the plastic body since it is only necessary that the exterior surface of the heat conductive body be in a position to be placed in thermal communication with an external heat sink or the like.

CONCLUSIONS, RAMIFICATIONS, AND SCOPE

Pre-molded package plastic body provides the environment to reduce the dielectric constant of semiconductor circuits sealing medium and reduces the limits on semiconductor circuits to performance at much higher frequencies.

Accordingly, it can be seen that use of a barrier plated heat spreader can provide an economical and direct thermal conduction path from the semiconductor circuit to the external surface of the pre-molded package plastic body. Use of pressure sensitive foil or thermal grease with aluminum oxide or the like provides for improved thermal dissipation of pre-molded package plastic body. Additionally, thermal performance is achieved by arranging the surface of the heat spreader to provide improved surface area and a method of molding the heat spreader that restricts the molding compound and mold flash from covering the heat spreader's exposed improved surface area.

Although the description above contains many specificities, these should not be construed as limiting the scope of the invention but as merely providing illustrations of some of the presently preferred embodiments of this invention. Various other embodiments and ramifications are possible within it's scope. Except for the configuration of the package itself, this invention is not limited to any particular materials used for pre-molded plastic packaging. It will be readily recognized that to fully exploit the advantages of the invention, the thermosetting materials used for plastic packages should be selected which plastic coefficient of thermal expansion between the plastic package and the device chip and/or the lead frame yet provide the desired physical and electrical characteristics.

Thus the scope of the invention should be determined by the appended claims and their legal equivalents, rather than by the examples given. From the foregoing description it will become apparent that by using the principles of the invention conventional plastic encapsulation techniques may be modified to form various configurations of plastic packages which efficiently and effectively conduct heat from the device semiconductor circuit to external surfaces of the packages. It will be appreciated, of course, that various combinations and variations of the specific embodiments illustrated and described can be used to achieve particular desired results. It is to be understood, therefore, that although the invention has been described with particular reference to specific embodiments thereof, the forms of the invention shown and described in detail are to be taken as preferred embodiments. Various changes, combinations and modifications thereof may be resorted to without departing from the spirit and scope of the invention as defined by the appended claims.

What is claimed is:

1. A pre-molded package structure for electronic circuit components comprising:
    (a) a lead frame defining a semiconductor circuit location having terminal leads extending therefrom;
    (b) a pre-molded body of plastic material enclosing the lead frame semiconductor circuit location and defining a package having opposed sides and opposed edges with terminal leads extending from at least one of said opposed edges;
    (c) an electronic semiconductor circuit positioned in said semiconductor circuit location and in electrical communication with said terminal leads; and (d) a body of thermally conductive material partially contained within said pre-molded body of plastic, said body of thermally conductive material having first and second opposed major faces and a retaining flange extending inward and at least partially defining the edge surfaces thereof connected to said lead frame with said first major face in thermal contact with said electronic semiconductor circuit and said second major face substantially parallel with and adjacent one of said opposed sides of said package extending to the surface of the package body.

2. A structure as defined in claim 1 wherein said lead frame includes a die paddle with a secured semiconductor circuit and said first major face of said thermally conductive body is secured to said die paddle with pressure sensitive foil, thermal grease filled with aluminum oxide, or the like and said thermally conductive body is barrier plated.

3. A structure as defined in claim 1 wherein said lead frame includes a die paddle with a secured semiconductor circuit and said first major face of said thermally conductive body is secured to said upper-face of semiconductor circuit with pressure sensitive foil, thermal grease filled with aluminum oxide, or the like and said thermally conductive body is barrier plated.

4. A structure as defined in claim 1 wherein said lead frame includes a die paddle with a secured semiconductor circuit and said first major face of said thermally conductive body is secured to said die paddle with pressure sensitive foil, thermal grease filled with aluminum oxide, or the like and said thermally conductive body is barrier plated; and said lead frame includes a die paddle with a secured semiconductor circuit and said first major face of said thermally conductive body is secured to said upper-face of semiconductor circuit with pressure sensitive foil, thermal grease filled with aluminum oxide, or the like and said thermally conductive body is barrier plated.

5. A structure as defined in claim 1 wherein said lead frame includes a die paddle with a secured rerouting board and said first major face of said thermally conductive body is secured to said die paddle with pressure sensitive foil, thermal grease filled with aluminum oxide, or the like and said thermally conductive body is barrier plated; and said lead frame includes a die paddle secured rerouting board with a secured semiconductor circuit and said first major face of said thermally conductive body is secured to said upper-face of semiconductor circuit with pressure sensitive foil, thermal grease filled with aluminum oxide, or the like and said thermally conductive body is barrier plated.

6. A structure as in claim 1, further comprising a barrier metal plated heat spreader composed of copper, oxygen-free high thermal conductivity copper or the like.

7. A structure as in claim 1, further comprising a pressure sensitive foil composed of copper, aluminum or the like to attach heat spreader to die paddle.

8. A structure as in claim 1, further comprising a pressure sensitive foil composed of copper, aluminum or the like to attach heat spreader to rerouting board.

9. A structure as in claim 1, further comprising a thermal grease composed of thermal grease and filled with aluminum oxide, aluminum nitride or the like, to attach heat spreader to die paddle.

10. A structure as in claim 1, further comprising a thermal grease composed of thermal grease and filled with aluminum oxide, aluminum nitride or the like, to attach heat spreader to rerouting board.

11. A structure as in claim 1, further comprising a pressure sensitive foil composed of copper, aluminum or the like to attach heat spreader to semiconductor circuit.

12. A structure as in claim 1, further comprising a thermal grease composed of thermal grease and filled with aluminum oxide, aluminum nitride or the like, to attach heat spreader to semiconductor circuit.

13. A structure as in claim 1, wherein at least one inwardly extending retaining flange is formed around the circumference of the exposed body section of the heat spreader to provide a mechanical interlock.

14. A structure as in claim 1, wherein the arrangement of heat spreader metal body increases the surface area of the heat spreader and provides for ejection molding without mold flash or molding compound on the heat spreader exposed improved surface area.

15. A structure as in claim 1, wherein at least one transmissive lens is formed in the seal lid to provide path for ultra violet, infrared, or optical rays to penetrate from the pre-molded package plastic body to the external environment.

16. A pre-molded package structure for electronic circuit components comprising:
(a) a lead frame defining a semiconductor circuit location having terminal leads extending therefrom;
(b) a pre-molded body of plastic material defining the lead frame semiconductor circuit location and defining a pre-molded package having opposed sides and opposed edges with terminal leads extending from at least one of said opposed edges;
(c) an electronic semiconductor circuit positioned in said semiconductor circuit location and in electrical communication with said terminal leads; and
(d) a body of thermally conductive material contained within said pre-molded body of plastic, said body of thermally conductive material having first and second opposed major faces and a retaining flange extending inward and at least partially defining the edge surfaces thereof connected to said lead frame with said first major face in thermal contact with said electronic semiconductor circuit and said second major face substantially parallel with and adjacent one of said opposed sides of said package but covered with a seal lid material.

17. A structure as defined in claim 16 wherein said lead frame includes a die paddle with a secured semiconductor circuit and said first major face of said thermally conductive body is secured to said die paddle with pressure sensitive foil, aluminum filled thermal grease, or the like and said thermally conductive body is barrier plated.

18. A structure as defined in claim 16 wherein said lead frame includes a die paddle with a secured semiconductor circuit and said first major face of said thermally conductive body is secured to said upper-face of semiconductor circuit with pressure sensitive foil, thermal grease filled with aluminum oxide, or the like and said thermally conductive body is barrier plated.

19. A structure as defined in claim 16 wherein said lead frame includes a die paddle with a secured semiconductor circuit and said first major face of said thermally conductive body is secured to said die paddle with pressure sensitive foil, thermal grease filled with aluminum oxide, or the like and said thermally conductive body is barrier plated; and said lead frame includes a die paddle with a secured semiconductor circuit and said first major face of said thermally conductive body is secured to said upper-face of semiconductor circuit with pressure sensitive foil, thermal grease filled with aluminum oxide, or the like and said thermally conductive body is barrier plated.

20. A structure as defined in claim 16 wherein said lead frame includes a die paddle with a secured rerouting board and said first major face of said thermally conductive body is secured to said die paddle with pressure sensitive foil, thermal grease filled with aluminum oxide or the like and said thermally conductive body is barrier plated; and said lead frame includes a die paddle secured rerouting board with a secured semiconductor circuit and said first major face of said thermally conductive body is secured to said upper-face of semiconductor circuit with no adhesive, pressure sensitive foil, thermal grease filled with aluminum oxide, or the like and said thermally conductive body is barrier plated.

21. A structure as in claim 16, further comprising a barrier metal plated heat spreader composed of copper, oxygen-free high thermal conductivity copper, or the like.

22. A structure as in claim 16, further comprising a pressure sensitive foil composed of copper, aluminum, or the like to attach heat spreader to die paddle.

23. A structure as in claim 16, further comprising a pressure sensitive foil composed of copper, aluminum, or the like to attach heat spreader to rerouting board.

24. A structure as in claim 16, further comprising a thermal grease composed of thermal grease and filled with aluminum oxide, aluminum nitride, or the like to attach heat spreader to die paddle.

25. A structure as in claim 16, further comprising a thermal grease composed of thermal grease and filled with aluminum oxide, aluminum nitride, or the like to attach heat spreader to rerouting board.

26. A structure as in claim 16, further comprising a pressure sensitive foil composed of copper, aluminum, or the like to attach heat spreader to semiconductor circuit.

27. A structure as in claim 16, further comprising a thermal grease composed of thermal grease and filled with aluminum oxide, aluminum nitride, or the like to attach heat spreader to semiconductor circuit.

28. A structure as in claim 16, wherein at least one inwardly extending retaining flange is formed around the circumference of the molded body section of the heat spreader to provide a mechanical interlock.

29. A structure as in claim 16, wherein at least one transmissive lens is formed in the seal lid to provide path for ultra violet, infrared, or optical rays to penetrate from the pre-molded package plastic body to the external environment.

30. A pre-molded package structure for electronic circuit components comprising:
    (a) a lead frame defining a semiconductor circuit location having terminal leads extending therefrom;
    (b) a pre-cast die attach cavity spacer attached to the lead frame providing semiconductor circuit location and defining a package having opposed sides and opposed edges with terminal leads extending from at least one of said opposed edges; and
    (c) wherein at least one body of thermally conductive material partially contained within said pre-molded body of plastic, said body of thermally conductive material having first and second opposed major faces and a retaining flange extending inward and at least partially defining the edge surfaces thereof connected to said lead frame with said first major face in thermal contact with said electronic semiconductor circuit and said second major face substantially parallel with and adjacent one of said opposed sides of said package extending to the surface of the package body.

31. A structure as in claim 30, wherein a routing board is used to interconnect the semiconductor circuit.

32. A structure as in claim 30, wherein lead frame and die paddle or rerouting board support pin holes provide thermal transfer paths to lead frame and die paddle or rerouting board.

33. A structure as in claim 30, wherein at least one transmissive lens is formed in the seal lid to provide path for ultra violet, infrared, or optical rays to penetrate from the pre-molded package plastic body to the external environment.

34. A structure for pre-molding electronic circuit packages components comprising:
    (a) a lead frame defining a semiconductor circuit location having terminal leads extending therefrom; and
    (b) an ejection or transfer mold with lead frame support pins providing the lead frame and die paddle or rerouting board mechanical support to prevent mold flash or bleed on or into the interconnection surface, die attach, or pre-mold cavity.

* * * * *